US006258613B1

(12) United States Patent
Iwamatsu

(10) Patent No.: US 6,258,613 B1
(45) Date of Patent: Jul. 10, 2001

(54) CONTROL METHODS OF SEMICONDUCTOR MANUFACTURING PROCESS, SEMICONDUCTOR MANUFACTURING EQUIPMENT, AND SEMICONDUCTOR MANUFACTURING ENVIRONMENT

(75) Inventor: Toshiaki Iwamatsu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/305,274

(22) Filed: May 5, 1999

(30) Foreign Application Priority Data

Nov. 26, 1998 (JP) .................................................. 10-335542

(51) Int. Cl.[7] .................................................. H01L 21/66
(52) U.S. Cl. ................................ 438/18; 438/10; 438/11; 438/17
(58) Field of Search ................................. 438/11, 10, 17, 438/18, FOR 141, FOR 142, FOR 146, FOR 476

(56) References Cited

FOREIGN PATENT DOCUMENTS 9-260447    10/1997   (JP) .

OTHER PUBLICATIONS

Wolf, Stanley. Silicon Processing for the VLSI Era, vol. 1, Process Technology. Lattic Press, Sunset Beach, California, pp. 63 and 66, 1986.*

* cited by examiner

*Primary Examiner*—George Fourson
*Assistant Examiner*—Michelle Estrada
(74) *Attorney, Agent, or Firm*—Oblon, Spivak, McClelland, Maier & Neustadt, P.C.

(57) ABSTRACT

A control method of semiconductor manufacturing equipment allows early detection of deterioration in the equipment. After cleaning the upper surface of an SOI layer (3), a silicon oxide film (4) is formed thereon by thermal oxidation. At this time, deterioration of a cleaning bath or an oxidation furnace causes the mixing of impurities (5) into a monitor wafer (50). Since the SOI wafer (3) has little gettering capabilities and the monitor wafer (50) has no impurity trap region, most of those impurities (5) are stored in the silicon oxide film (4), etc. The stored impurities (5) cause anomalies in the thickness or quality of the silicon oxide film (4), so that the evaluated characteristics of the silicon oxide film (4) vary from the normal. Accordingly, deterioration in the semiconductor manufacturing equipment can be judged when the characteristics of the silicon oxide film (4) vary from the normal.

12 Claims, 18 Drawing Sheets

CONTROL METHODS OF SEMICONDUCTOR MANUFACTURING PROCESS, SEMICONDUCTOR MANUFACTURING EQUIPMENT, AND SEMICONDUCTOR MANUFACTURING ENVIRONMENT

BACKGROUND OF THE INVENTION

1. Field of the Invention

The present invention relates to a control method of a semiconductor manufacturing process such as a thermal oxidation step and an ion implantation step, a control method of semiconductor manufacturing equipment such as an oxidation furnace and an ion implanter, and a control method of a semiconductor manufacturing environment such as a clean room.

2. Description of the Background Art

Conventionally, a silicon wafer used in many semiconductor devices was a wafer produced by growing a crystal by the Czochralski method (hereinafter referred to as "CZ wafer"). The CZ wafer, however, has a number of COPs (Crystal Originated Particle), and the size of COPs compared to the element size has been increasing with a recent trend of high integration and downsizing. The existence of COPs thus caused reduced yield of semiconductor device manufacturing. Thus, in recent years, many semiconductor devices have employed a wafer produced by growing an epitaxial layer on a CZ substrate (hereinafter referred to as "epitaxial wafer") as a silicon wafer.

FIG. 31 is a cross-sectional view showing the structure of an epitaxial wafer 100. By an epitaxial growth method, an epitaxial layer 102 is formed on the upper surface of a CZ substrate 101. The epitaxial wafer itself generally has higher gettering capabilities than the CZ wafer, but in most cases, impurity trap regions are formed inside or on the rear surface of the wafer for further improvement of the gettering capabilities. Especially, a gettering technique for forming a PBS (Polysilicon Back Seal) 103 of polysilicon on the rear surface of the wafer has widely been employed as for the epitaxial wafer 100 shown in FIG. 31.

In this fashion, it has been a common practice in recent years to manufacture semiconductor devices such as an LSI (Large Scale Integrated circuit) by the use of an epitaxial wafer with a PBS on the rear surface. This specification is also presented on the premise that a semiconductor device is formed on an epitaxial wafer with a PBS on the rear surface, namely, the epitaxial wafer 100 in FIG. 31. Further, in the specification, a wafer on which a semiconductor device as a product is formed is especially referred to as "product wafer".

LSIs are manufactured through a number of semiconductor manufacturing steps such as oxidation, diffusion, implantation, sputtering, and etching. To manufacture high-performance semiconductor devices, those steps are controlled. Now, we will describe a conventional control method of a semiconductor manufacturing process, e.g., a process for manufacturing a gate oxide film. The manufacturing process of gate oxide films means a series of steps of cleaning a silicon substrate, forming a gate oxide film by thermal oxidation, and depositing a polysilicon film on the gate oxide film. Thus, control of the manufacturing process of gate oxide films indicates control of the presence or absence of imperfections in the series of steps, e.g., control of the presence or absence of deterioration in the semiconductor manufacturing equipment (cleaning bath, oxidation furnace, CVD device, etc.) for use in the manufacturing process of gate oxide films.

The control of the manufacturing process of gate oxide films is intended, for example, to ensure reliability of gate oxide films formed on a product wafer. To achieve this, a control-only wafer (hereinafter referred to as "monitor wafer") different from the product wafer is used. FIG. 32 is a cross-sectional view showing the structure of a monitor wafer 104. The epitaxial layer 102 is formed on the upper surface of the CZ substrate 101 by the epitaxial growth method. On the rear surface of the CZ substrate 101, the PBS 103 is formed. A comparison between FIGS. 32 and 31 shows that the same type of wafer used as the product wafer is used as the monitor wafer. Thus, the control of the manufacturing process of gate oxide films is accomplished by forming a gate oxide film on the upper surface of the monitor wafer 104 and evaluating the characteristics of that gate oxide film. More specifically, an MOS structure is formed with the gate oxide film and the characteristics of that gate oxide film are evaluated using well-known evaluation techniques such as leakage current evaluation, C-V evaluation, Time Zero Dielectric Breakdown (TZDB) evaluation, and Time Dependence Dielectric Breakdown (TDDB) evaluation. When the obtained characteristics show no variation from the normal, we can judge that there is no imperfection in the manufacturing process. When the characteristics vary from the normal, we can judge that there are imperfections in the manufacturing process.

On the other hand, to stabilize the manufacture of high-performance semiconductor devices, it is important not only to control the semiconductor manufacturing process as described above but also to control semiconductor manufacturing equipment, e.g., to control deterioration in the semiconductor manufacturing equipment. Equipment for manufacturing gate oxide films, for example, includes a cleaning bath for cleaning a silicon substrate and an oxidation furnace for thermally oxidizing the cleaned silicon substrate. Now, we will describe a conventional control method of semiconductor manufacturing equipment, e.g., an oxidation furnace. Deterioration of the oxidation furnace can be detected by variations in the characteristics of the gate oxide film evaluated during the above control of the semiconductor manufacturing process. FIGS. 33 and 34 are cross-sectional views to explain the conventional control method of the semiconductor manufacturing equipment. By thermal oxidation using the oxidation furnace, a silicon oxide film 105 is formed on the upper surface of the epitaxial layer 102 in the monitor wafer 104. At this time, deterioration of the oxidation furnace causes the mixing of impurities 106 into the monitor wafer 104. Although some of the impurities 106 are absorbed by the gettering capabilities of the monitor wafer 104 itself or of the PBS 103, the other are stored in the silicon oxide film 105 or in the interface between the epitaxial layer 102 and the silicon oxide film 105. This results in fluctuations in the oxidation rate, etc., causing anomalies in the thickness or quality of the silicon oxide film 105. In this condition, when a polysilicon film 107 is formed on the silicon oxide film 105 to evaluate the characteristics of the silicon oxide film 105, the evaluated characteristics vary from those in normal conditions. Accordingly, we can judge deterioration of the oxidation furnace when the characteristics of the silicon oxide film 105 vary from the normal.

The control of the semiconductor manufacturing equipment by this method is applicable not only to the manufacturing equipment of gate oxide films but also to other semiconductor manufacturing equipment such as an ion implanter. For instance, deterioration of the ion implanter causes the mixing of impurities such as Fe into the monitor wafer 104. In this case, by evaluating the characteristics of the silicon oxide film 105 after ion implantation and checking the presence or absence of variations in the characteristics from the normal, deterioration of the ion implanter can be evaluated.

On the other hand, as the semiconductor manufacturing process is carried out in a clean room, cleanliness of the clean room has great influence over reliability of semiconductor devices to be manufactured. When impurities (boron, phosphorus, etc.) in a filter provided in the clean room are dissolved by HF vapor and thereby cleanliness of the clean room is deteriorated, for example, those impurities are deposited on the product wafer, resulting in variations in characteristics and deterioration in reliability of semiconductor devices to be formed. Thus, it is also necessary to control the cleanliness of the clean room to ensure reliability of semiconductor devices. FIGS. 35 and 36 are cross-sectional views to explain a conventional control method of the semiconductor manufacturing environment. The monitor wafer 104 is left in a clean room for a given period of time. At this time, deterioration in the cleanliness of the clean room causes deposition of impurities 108 on the epitaxial layer 102. When the silicon oxide film 105 is formed on the epitaxial layer 102 in this condition, although some of the impurities 108 are absorbed by the gettering capabilities of the monitor wafer 104 itself or of the PBS 103, the other are stored in the silicon oxide film 105 and in the interface between the epitaxial layer 102 and the silicon oxide film 105. This results in anomalies in the thickness or quality of the silicon oxide film 105. In this condition, when a polysilicon film 107 is formed on the silicon oxide film 105 to evaluate the characteristics of the silicon oxide film 105, the evaluated characteristics vary from those in normal conditions. Accordingly, we can judge deterioration in the cleanliness of the clean room when the characteristics of the silicon oxide film 105 vary from the normal.

According to the aforementioned conventional control methods of the semiconductor manufacturing process, the semiconductor manufacturing equipment, and the semiconductor manufacturing environment, the characteristics of the gate oxide film were evaluated on the premise that the impurities mixed in the monitor wafer due to imperfections in the semiconductor manufacturing process or deterioration in the semiconductor manufacturing equipment and the impurities deposited on the monitor wafer due to deterioration in the cleanliness of the semiconductor manufacturing environment affected the thickness or quality of the gate oxide film formed on the monitor wafer. Thus, imperfections in the semiconductor manufacturing process, deterioration in the semiconductor manufacturing equipment, and variations in the semiconductor manufacturing environment were detected by checking the presence or absence of variations in the characteristics of the gate oxide film.

However, with minor imperfection in the semiconductor manufacturing process, slight deterioration in the semiconductor manufacturing equipment, or a small variation in the semiconductor manufacturing environment, the impurities mixed in or deposited on the monitor wafer will be completely absorbed by the gettering capabilities of the monitor wafer itself or of the PBS. FIG. 37 shows such a state, where the impurities 106 and 108 are completely absorbed in the PBS 103 and none of them remain in the silicon oxide film 105 or in the interface between the epitaxial layer 102 and the silicon oxide film 105. In this case, the characteristics of the gate oxide film shows no variation, so that it is impossible to detect imperfections in the semiconductor manufacturing process, deterioration in the semiconductor manufacturing equipment, and variations in the semiconductor manufacturing environment.

SUMMARY OF THE INVENTION

A first aspect of the present invention is directed to a control method of a semiconductor manufacturing process for manufacturing a semiconductor device as a product. The method comprises the steps of: (a) preparing a monitor wafer having lower gettering capabilities than a product wafer on which the semiconductor device is formed; (b) performing the semiconductor manufacturing process for the monitor wafer; (c) forming an insulating film on the monitor wafer in the step (b) or in a step other than the step (b); and (d) evaluating imperfections in the semiconductor manufacturing process by conducting a test on the characteristics of the insulating film and detecting the mixing of impurities into the monitor wafer during the semiconductor manufacturing process by variations in the characteristics of the insulating film.

Preferably, according to a second aspect of the present invention, in the step (a) of the method of the first aspect, either of an SOI wafer, a CZ wafer, or an epitaxial wafer produced by growing a p-type epitaxial wafer on a p$^-$ type substrate is prepared as the monitor wafer, each wafer having no impurity trap region.

A third aspect of the present invention is directed to a control method of semiconductor manufacturing equipment for manufacturing a semiconductor device as a product. The method comprises the steps of: (a) preparing a monitor wafer having lower gettering capabilities than a product wafer on which the semiconductor device is formed; (b) performing a predetermined semiconductor manufacturing process for the monitor wafer, by the use of the semiconductor manufacturing equipment; (c) forming an insulating film on the monitor wafer in the step (b) or in a step other than the step (b); and (d) evaluating deterioration in the semiconductor manufacturing equipment by conducting a test on the characteristics of the insulating film and detecting the mixing of impurities into the monitor wafer during the semiconductor manufacturing process by variations in the characteristics of the insulating film.

Preferably, according to a fourth aspect of the present invention, in the step (a) of the method of the third aspect, either of an SOI wafer, a CZ wafer, or an epitaxial wafer produced by growing a p-type epitaxial layer on a p$^-$ type substrate is prepared as the monitor wafer, each wafer having no impurity trap region.

A fifth aspect of the present invention is directed to a control method of a semiconductor manufacturing environment for performing a semiconductor manufacturing process for manufacturing a semiconductor device as a product. The method comprises the steps of: (a) preparing a monitor wafer having lower gettering capability than a product wafer on which the semiconductor device is formed; (b) leaving the monitor wafer in the semiconductor manufacturing environment for a given period of time; (c) after the step (b), forming an insulating film on the monitor wafer; (d) evaluating variations in the semiconductor manufacturing environment by conducting a test on the characteristics of the insulating film and detecting deposition of impurities on the monitor wafer during neglect of the monitor wafer by variations in the characteristics of the insulating film.

Preferably, according to a sixth aspect of the present invention, in the step (a) of the method of the fifth aspect, either of an SOI wafer, a CZ wafer, or an epitaxial wafer produced by growing a p-type epitaxial layer on a p$^-$ type substrate is prepared as the monitor wafer, each wafer having no impurity trap region.

In the method of the first aspect, a wafer having lower gettering capabilities than the product wafer is used as a monitor wafer. Thus, when impurities are mixed into the monitor wafer due to imperfections in the semiconductor manufacturing process, e.g., due to deterioration in the semiconductor manufacturing equipment used in the process, most of the impurities are stored in the insulating film or in the interface between the insulating film and the monitor wafer. Accordingly, even if the amount of impurities mixed in the monitor wafer is quite small because of minor imperfections in the semiconductor manufacturing process, the characteristics of the gate insulating film vary from the normal. This allows early detection of imperfections in the semiconductor manufacturing process.

In the method of the second aspect, when an epitaxial wafer with impurity trap regions is used as a product wafer, the monitor wafer can have lower gettering capabilities than the product wafer.

In the method of the third aspect, the wafer having lower gettering capabilities than the product wafer is used as a monitor wafer. Thus, when impurities are mixed into the monitor wafer due to deterioration in the semiconductor manufacturing equipment, most of the impurities are stored in the insulating film or in the interface between the insulating film and the monitor wafer. Accordingly, even if the amount of impurities mixed in the monitor wafer is quite small due to slight deterioration in the semiconductor manufacturing equipment, the characteristics of the insulating film vary from the normal. This allows early detection of deterioration in the semiconductor manufacturing equipment.

In the method of the fourth aspect, when an epitaxial wafer with impurity trap regions is used as a product wafer, the monitor wafer can have lower gettering capabilities than the product wafer.

In the method of the fifth aspect, when the monitor wafer is left in the semiconductor manufacturing environment for a given period of time, impurities are deposited on the monitor wafer due to variations in the semiconductor manufacturing environment, e.g., deterioration in the cleanliness of the semiconductor manufacturing environment. Since the wafer having lower gettering capabilities than the product wafer is used as a monitor wafer, when an insulating film is formed on the monitor wafer in this condition, most of the impurities are stored in the insulating film or in the interface between the insulating film and the monitor wafer. Accordingly, even if the amount of impurities deposited on the monitor wafer is quite small due to a small variation in the semiconductor manufacturing environment, the characteristics of the insulating film vary from the normal. This allows early detection of variations in the semiconductor manufacturing environment.

In the method of the sixth aspect, when an epitaxial wafer with impurity trap regions is used as a product wafer, the monitor wafer can have lower gettering capabilities than the product wafer.

Thus, the objective of the present invention is to achieve control methods of the semiconductor manufacturing process, the semiconductor manufacturing equipment, and the semiconductor manufacturing environment, which allow early detection of imperfections in the semiconductor manufacturing process, deterioration in the semiconductor manufacturing equipment, and variations in the semiconductor manufacturing environment to ensure high reliability of semiconductor devices while achieving improved yield of semiconductor device manufacturing.

These and other objects, features, aspects and advantages of the present invention will become more apparent from the following detailed description of the present invention when taken in conjunction with the accompanying drawings.

DESCRIPTION OF THE PREFERRED EMBODIMENTS

1. First Preferred Embodiment

Figure 1:
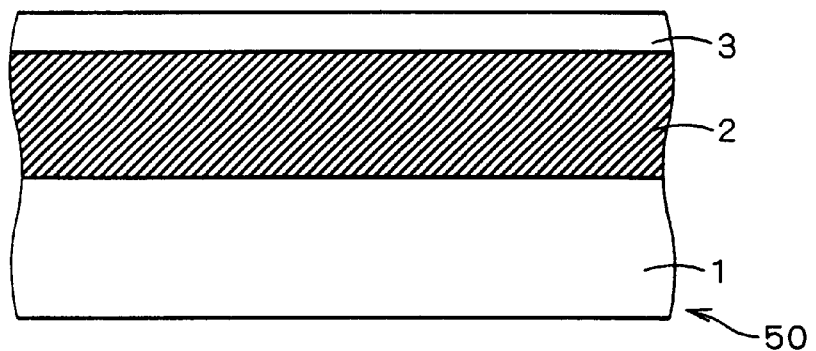
FIG. 1 is a cross-sectional view showing the structure of a monitor wafer.
Figure 31:
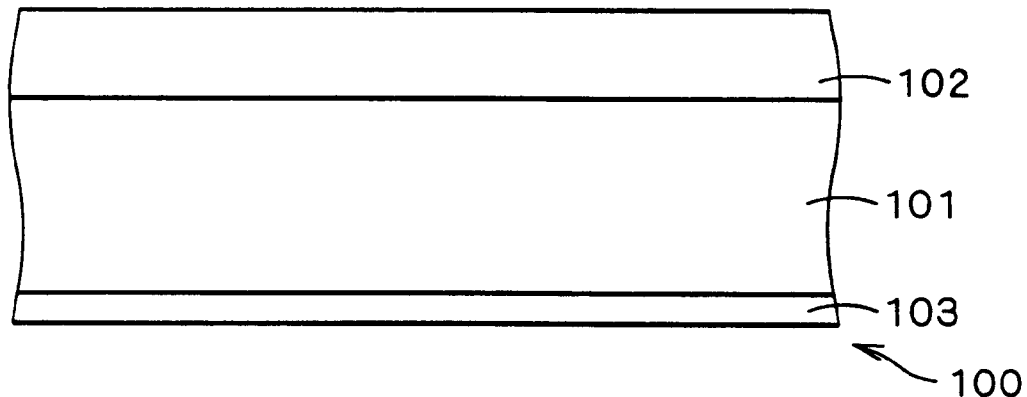
FIG. 31 is a cross-sectional view showing the structure of an epitaxial wafer.
Figure 32:
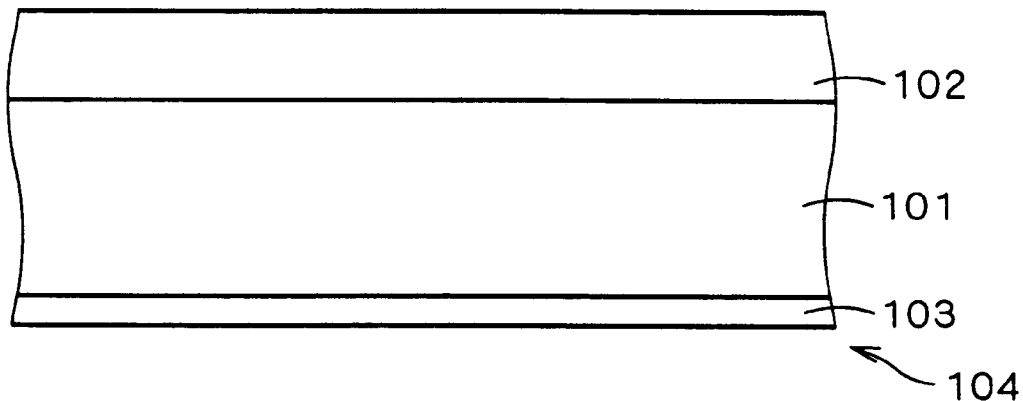
FIG. 32 is a cross-sectional view showing the structure of a monitor wafer.
Figure 33:
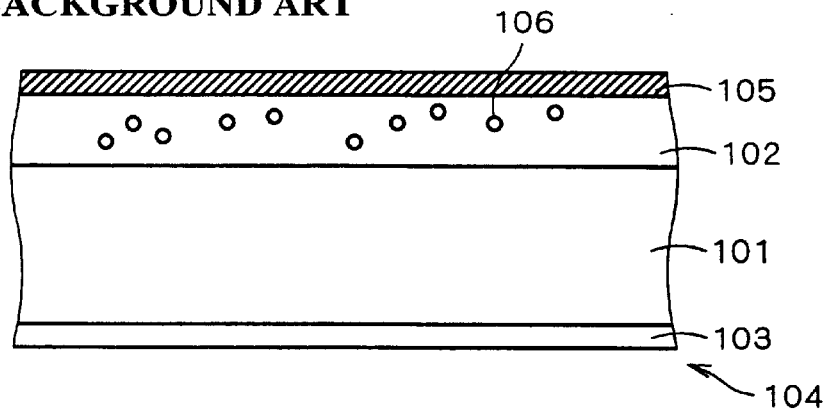
FIGS. 33 and 34 are cross-sectional views to explain a conventional control method of semiconductor manufacturing equipment.
Figure 34:
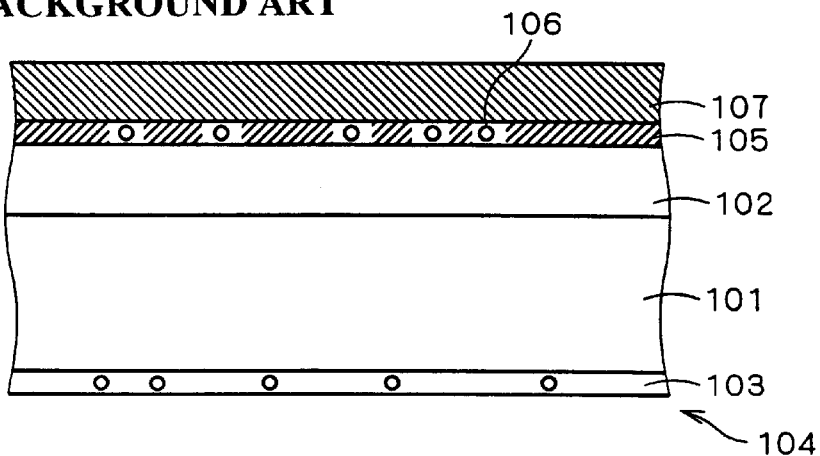
Figure 35:
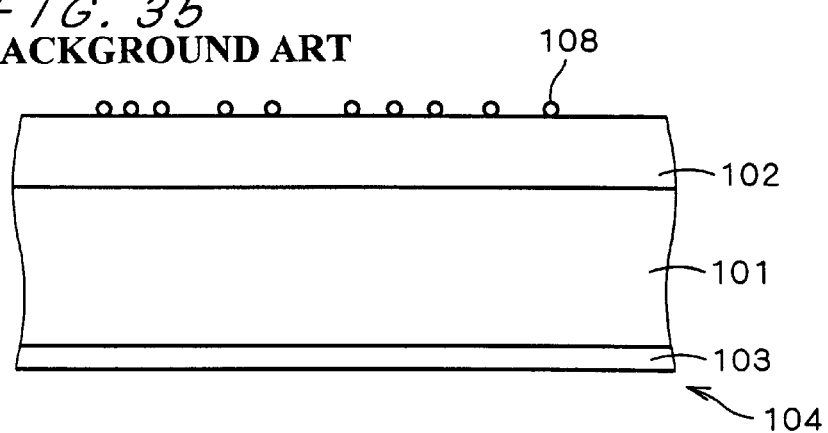
FIGS. 35 and 36 are cross-sectional views to explain a conventional control method of a semiconductor manufacturing environment.
Figure 36:
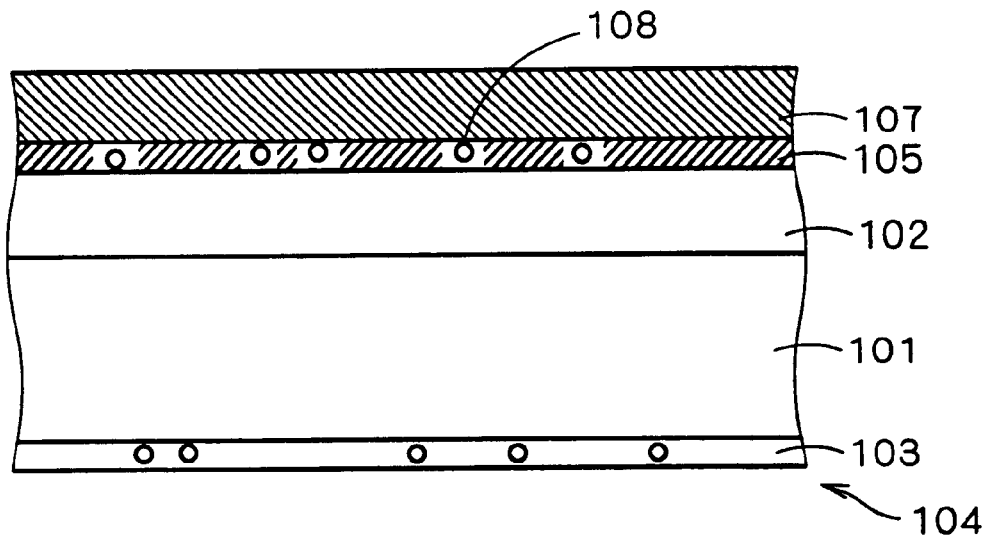
Figure 37:
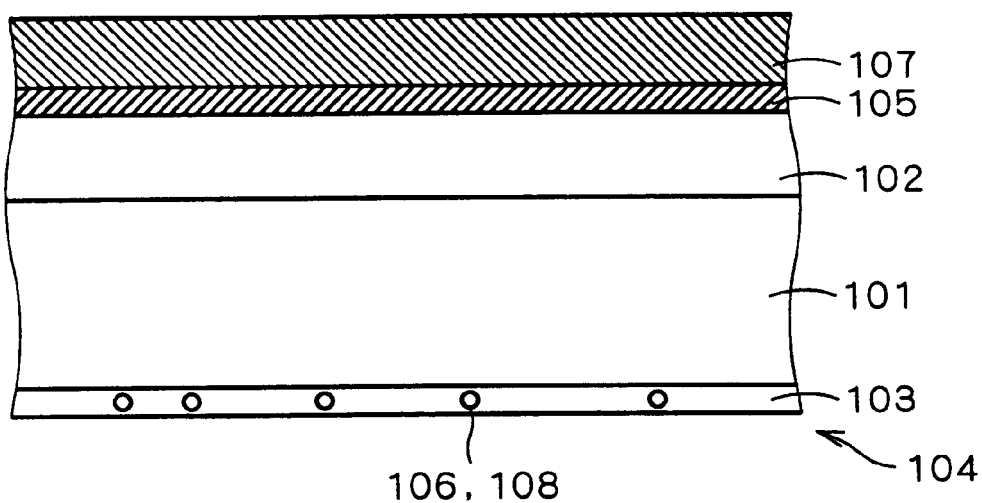
FIG. 37 is a cross-sectional view showing a state that impurities are completely absorbed in the monitor wafer or in a PBS.

FIG. 1 is a cross-sectional view showing the structure of a monitor wafer 50 used in both control methods of a semiconductor manufacturing process and semiconductor manufacturing equipment according to a first preferred embodiment of the present invention. The monitor wafer 50 comprises a silicon substrate 1, a buried oxide film 2 formed on the silicon substrate 1, and an SOI (Silicon On Insulator) layer 3 formed on the buried oxide film 2. That is, an SOI wafer is used as a monitor wafer in the control methods of the semiconductor manufacturing process and the semiconductor manufacturing equipment according to the first preferred embodiment. Here the SOI wafer may be an SIMOX (Separation by IMplanted OXygen) wafer on which a buried oxide film is formed for example by oxide ion implantation, or a laminated wafer consisting of a bond wafer and a base wafer, or any other SOI wafer formed by other methods. It is also possible to use single crystalline silicon or polysilicon formed on an insulating film. Further, no impurity trap region such as a PBS is formed in the monitor wafer 50. As a product wafer, a wafer shown in FIG. 31 (i.e., epitaxial wafer with a PBS on the rear surface) is used, for example.

As in the aforementioned conventional techniques, the control of the manufacturing process of gate oxide films, for example, is accomplished by forming a gate oxide film on the upper surface of the monitor wafer 50 and then evaluating the characteristics of that gate oxide film. More specifically, an MOS structure is formed with the gate oxide film and then the characteristics of that gate oxide film are evaluated using well-known evaluation techniques such as leakage-current evaluation, C-V evaluation, TZDB evaluation, and TDDB evaluation.

Figure 2:
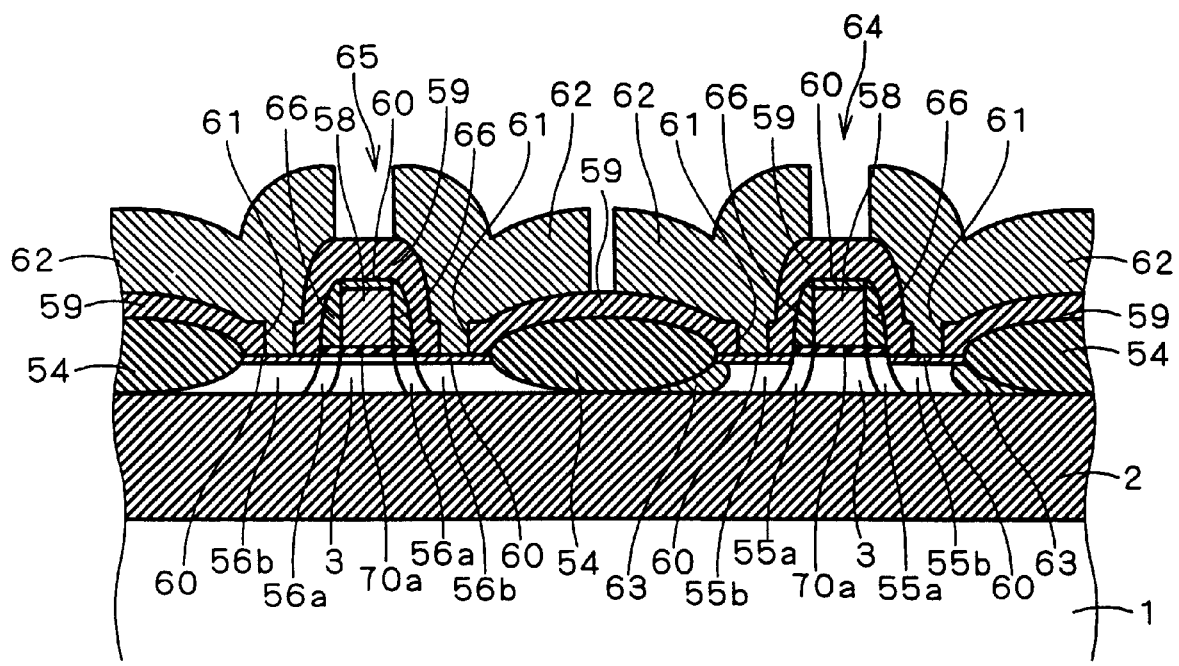
FIG. 2 is a cross-sectional view showing the structure of a process control device.

FIG. 2 is a cross-sectional view showing the structure of a semiconductor device having an MOS structure with the monitor wafer 50. This semiconductor device is manufactured specifically for the control of the semiconductor manufacturing process, so it is referred to especially as "process control device" in the specification. In the SOI layer 3, an n-MOS transistor 64 and a p-MOS transistor 65 are formed. The n-MOS transistor 64 has an $n^{31}$ region 55a and $n^+$ region 55b formed in the SOI layer 3; a gate oxide film 70a; and a gate electrode 58. The p-MOS transistor 65 has a $p^-$ region 56a and $p^+$ region 56b formed in the SOI layer 3; a gate oxide film 70a; and a gate electrode 58. Then, titanium silicide layers 60 are formed on the respective surfaces of the $n^+$ region 55b and the $p^+$ region 56b and on the upper surfaces of the gate electrodes 58. On the sidewalls of the gate electrodes 58, sidewall insulating layers 66 are formed. The n-MOS transistor 64 and the p-MOS transistor 65 are isolated from each other by isolation oxide films 54 selectively formed in the SOI layer 3. On a side end portion of the SOI layer 3 where the n-MOS transistor 64 is formed, a high concentration impurity region 63 is formed for element isolation. Further, interlayer insulating films 59 are formed to cover the SOI layer 3. These interlayer insulating films 59 have contact holes 61 in given places. Then, metal electrodes 62 are formed in the contact holes 61 and on the interlayer insulating films 59.

Figure 3:
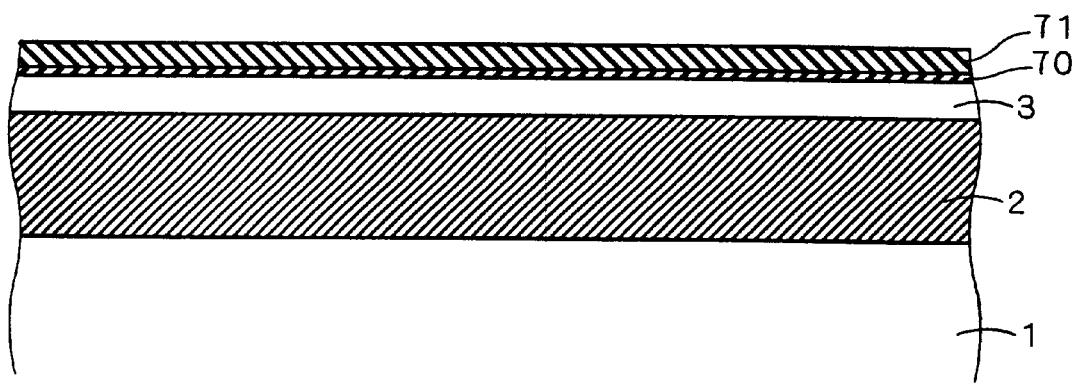
FIGS. 3 through 26 are cross-sectional views showing a sequence of manufacturing steps of the process control device.

FIGS. 3 through 26 are cross-sectional views showing a sequence of manufacturing steps of the process control device in FIG. 2. First, the surface of the SOI layer 3 is oxidized in a wet atmosphere at about 950° C. to form an oxide film 70 having a thickness of about 300 angstroms. Then, by a CVD method, a nitride film 71 having a thickness of about 500 angstroms is formed on the oxide film 70 (FIG. 3).

Figure 4:
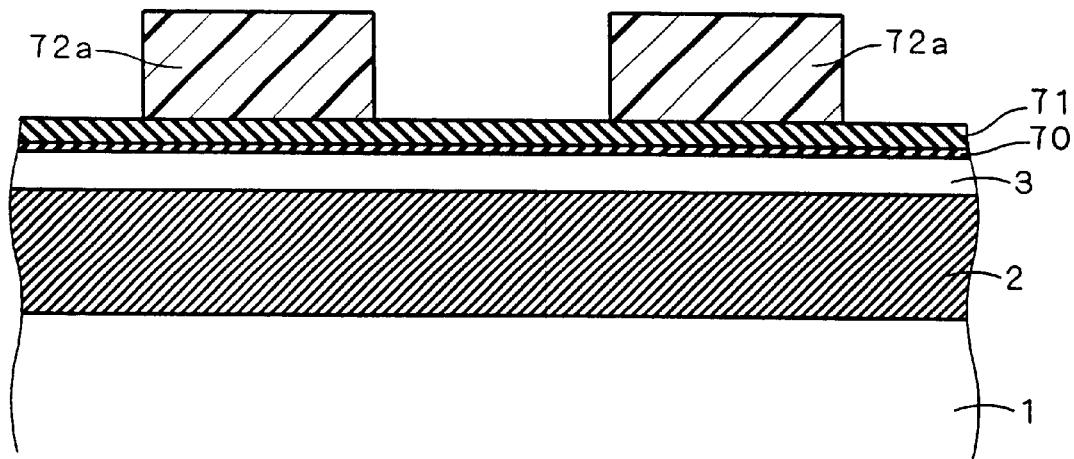
Figure 5:
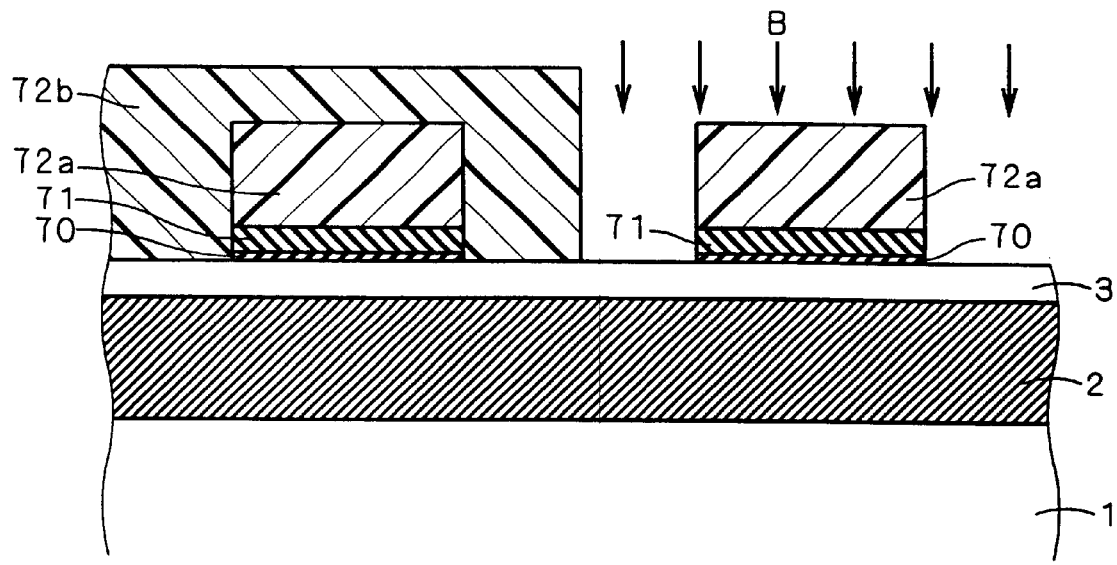

A resist is then coated on the nitride film 71 and patterned in a given shape to form resist patterns 72a (FIG. 4). After that, a resist pattern 72b is formed to cover a forming region of the p-MOS transistor 65. With the resist patterns 72a and 72b as masks, boron ions are implanted into the SOI layer 3 (FIG. 5). The implantation is performed at a dose of $3 \times 10^{13}/cm^2$ and an implant energy of 20 keV. However, if the purpose is to control an ion implanter which will be described later, the implant dose is raised to $4 \times 10^{14}/cm^2$.

Figure 6:
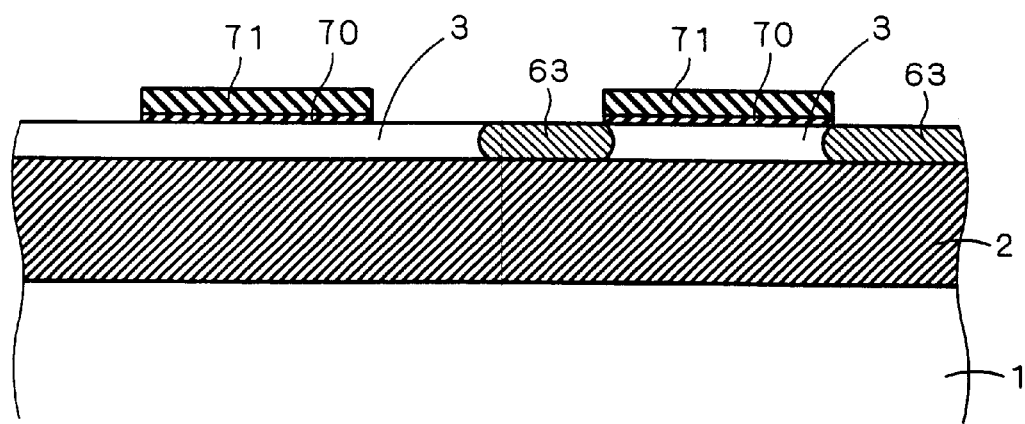
Figure 7:
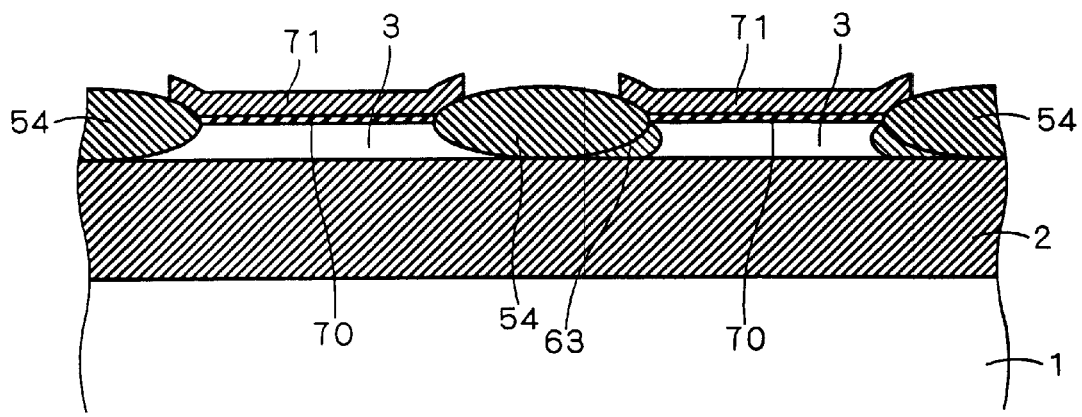
Figure 8:
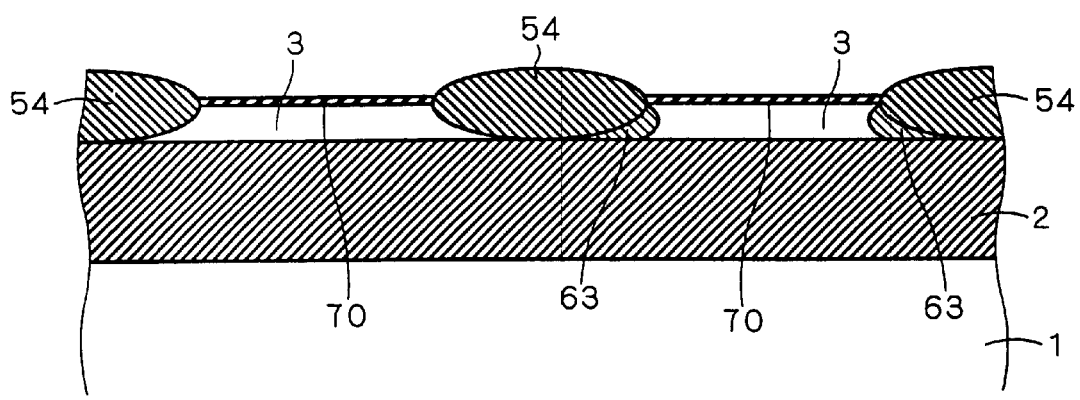

After the removal of the resist patterns 72a and 72b, the SOI layer 3 is subjected to heat treatment to form the p-type high concentration impurity regions 63 (FIG. 6). The SOI layer 3 is then selectively oxidized with the nitride film 71 as a mask to form isolation oxide films 54 (FIG. 7). The selective oxidation is performed in a wet atmosphere at 950° C. for about 60 minutes. The nitride film 71 is then removed using, for example, thermal phosphoric acid (FIG. 8).

Figure 9:
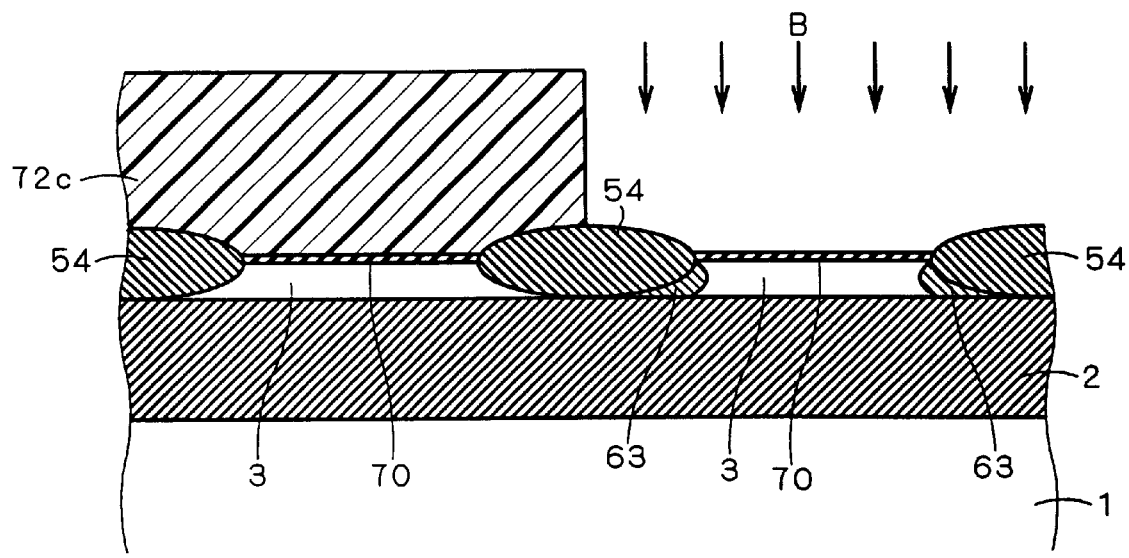
Figure 10:
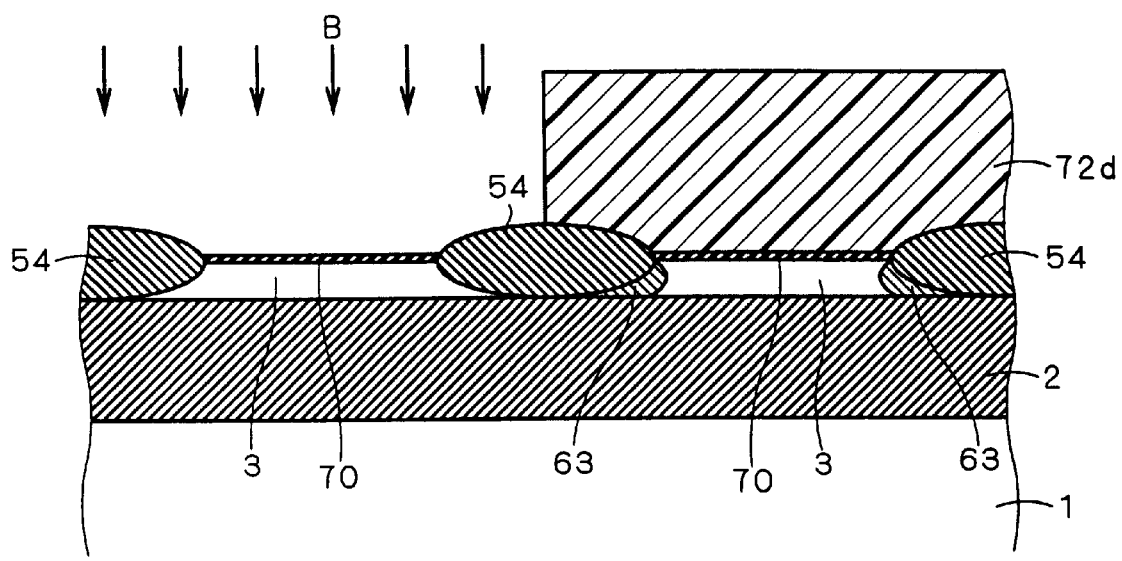

Then, a resist pattern 72c is formed to cover the forming region of the p-MOS transistor 65, and boron ions are implanted into the SOI layer 3 with the resist pattern 72c as a mask (FIG. 9). This causes channel doping of the n-MOS transistor 64. After the removal of the resist pattern 72c, a resist pattern 72d is formed to cover a forming region of the n-MOS transistor 64, and boron ions are implanted into the SOI layer 3 with the resist pattern 72d as a mask (FIG. 10). This causes channel doping of the p-MOS transistor 65.

Figure 11:
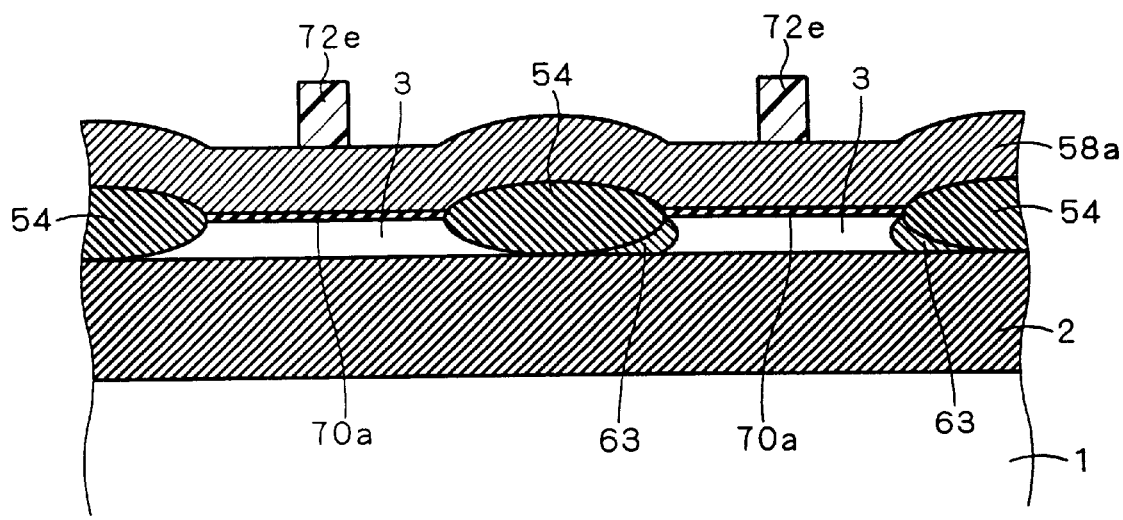
Figure 12:
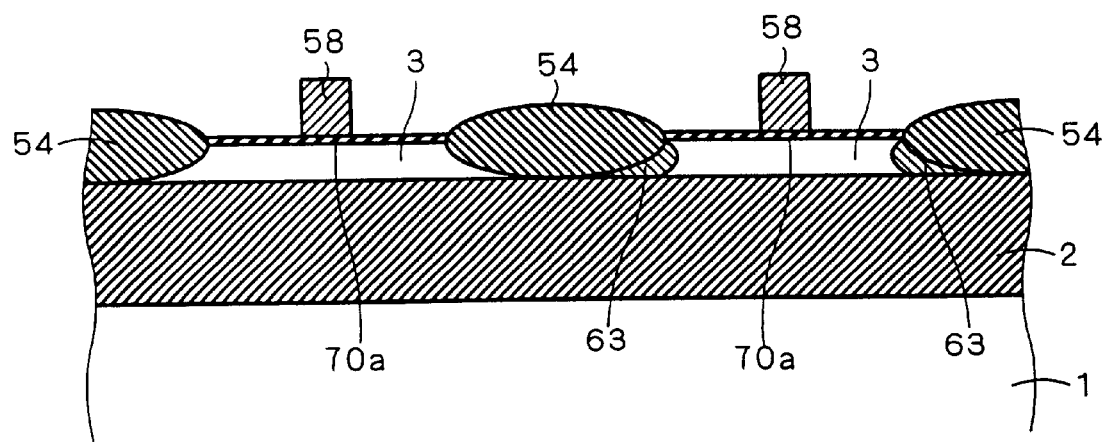

The resist pattern 72d and the oxide film 70 are then removed and the upper surface of the SOI layer 3 are cleaned by a cleaning bath. Then, by thermal oxidation at about 750° C. by the use of an oxidation furnace, the gate oxide films 70a having a thickness in the range of about 70 to 100 angstroms are formed on the upper surface of the SOI layer 3. Here the same cleaning bath and oxidation furnace used in the manufacture of the product semiconductor device are used. Then, by a CVD or other method, a polysilicon film 58a having a thickness of about 3000 angstroms is formed on the entire surface, and resist patterns 72e are formed thereon (FIG. 11). With the resist patterns 72e as masks, the polysilicon films 58a are etched to form the gate electrodes 58. The resist patterns 72e are then removed (FIG. 12).

Figure 13:
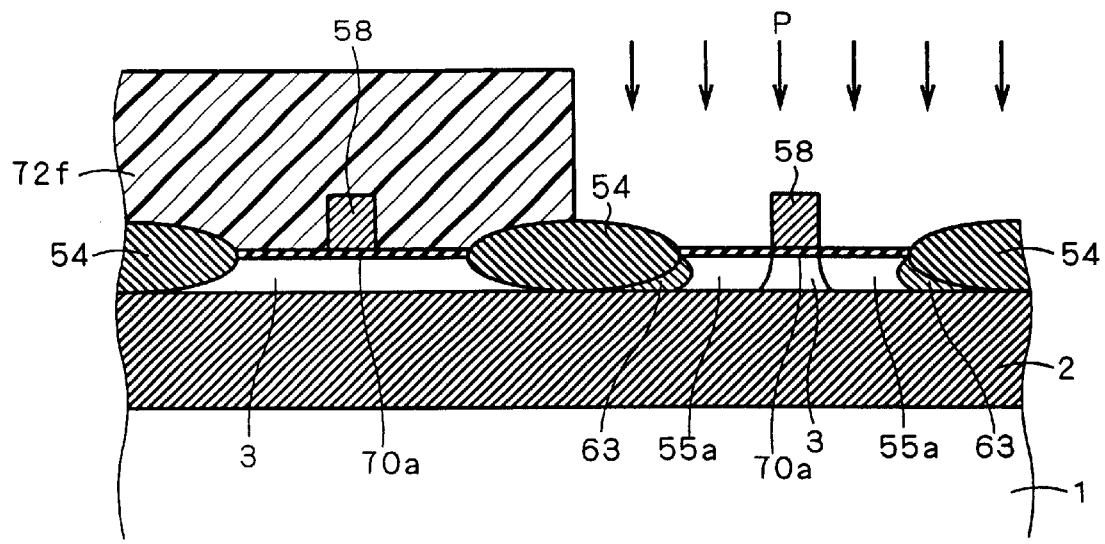
Figure 14:
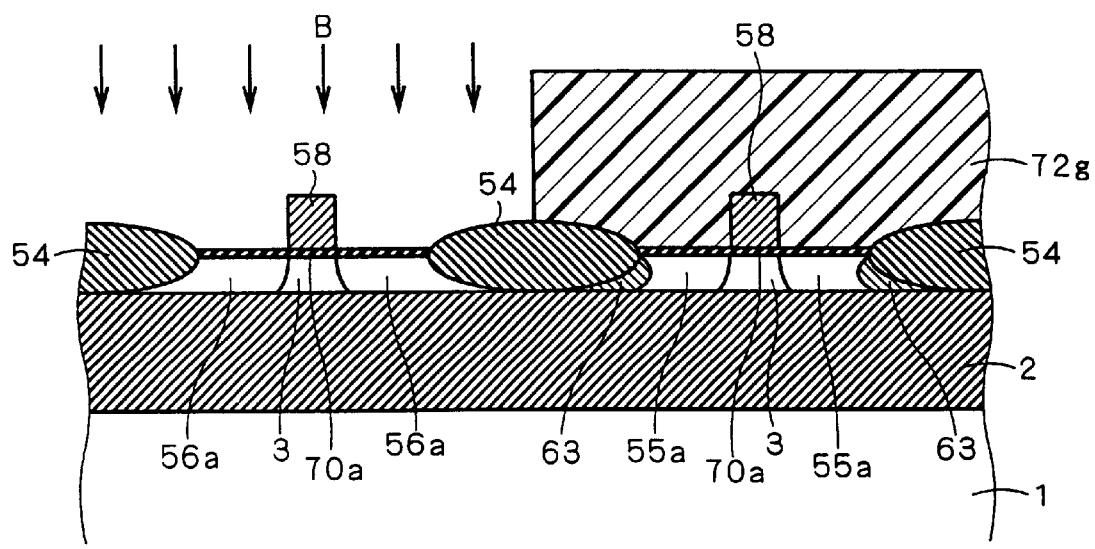

Then, a resist pattern 72f is formed to cover the forming region of the p-MOS transistor 65. With the resist pattern 72f as a mask, phosphorus ions are implanted into the SOI layer 3, by which the $n^{31}$ regions 55a are formed (FIG. 13). After the removal of the resist pattern 72f, a resist pattern 72g is formed to cover the forming region of the n-MOS transistor 64. With the resist pattern 72g as a mask, boron ions are implanted into the SOI layer 3, by which the $p^-$ regions 56a are formed (FIG. 14).

Figure 15:
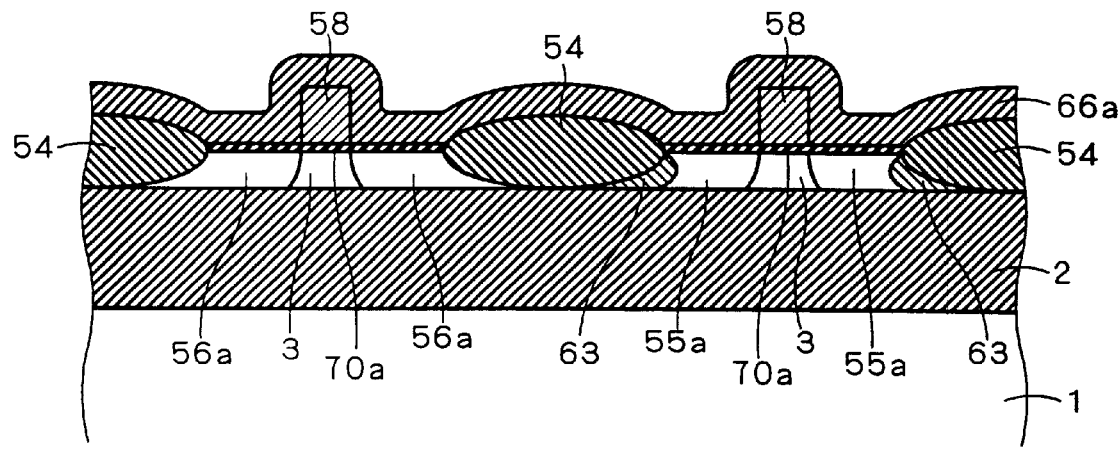
Figure 16:
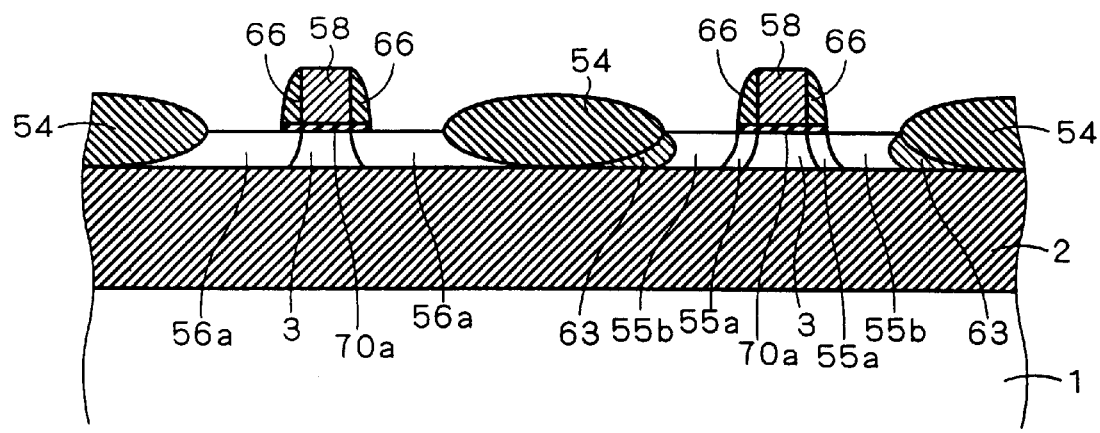

After the removal of the resist pattern 72g, a TEOS (Tetra-Ethyl-Ortho-Silicate) oxide film 66a having a thickness of about 1500 angstroms is formed on the entire surface (FIG. 15). The TEOS oxide film 66a is then anisotropically etched to form the sidewall insulating layers 66 on the sidewalls of the gate electrodes 58 (FIG. 16).

Figure 17:
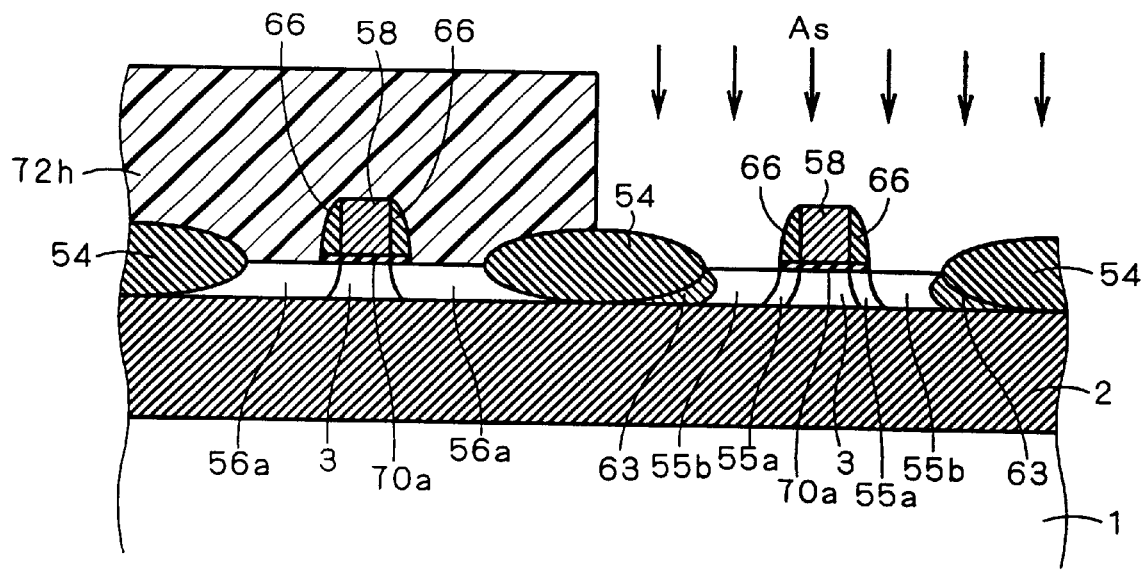
Figure 18:
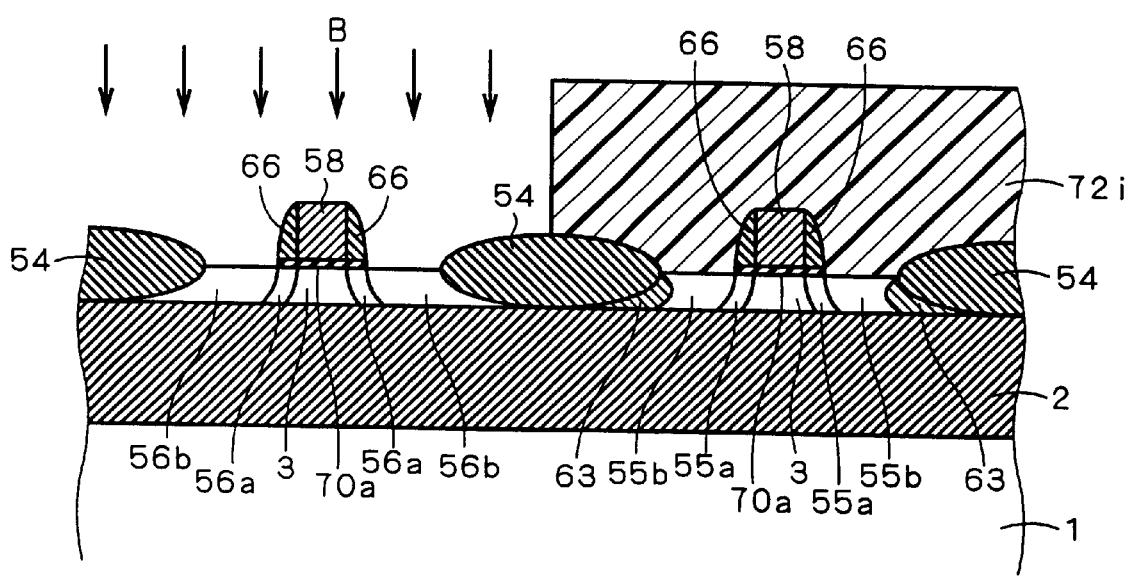
Figure 19:
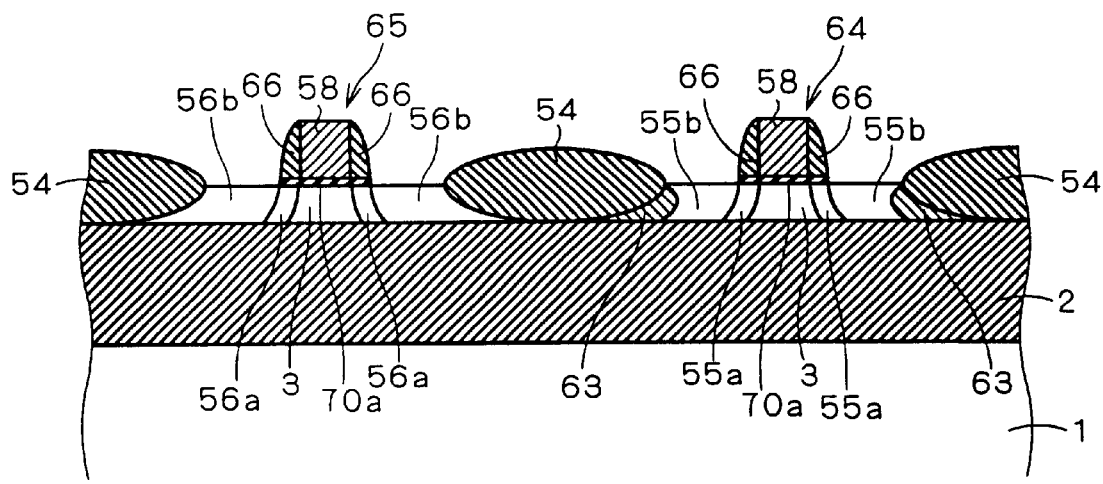

Then, a resist pattern 72h is formed to cover the forming region of the p-MOS transistor 65. With the resist pattern 72h as a mask, arsenic ions are implanted into the SOI layer 3, by which the $n^+$ regions 55b are formed (FIG. 17). After the removal of the resist pattern 72h, a resist pattern 72i is formed to cover the forming region of the n-MOS transistor 64. With the resist pattern 72i as a mask, boron ions are implanted into the SOI layer 3, by which the $p^+$ regions 56b are formed (FIG. 18). The resist pattern 72i is Then removed. Through these steps, the n-MOS transistor 64 and the p-MOS transistor 65 are formed (FIG. 19).

Figure 20:
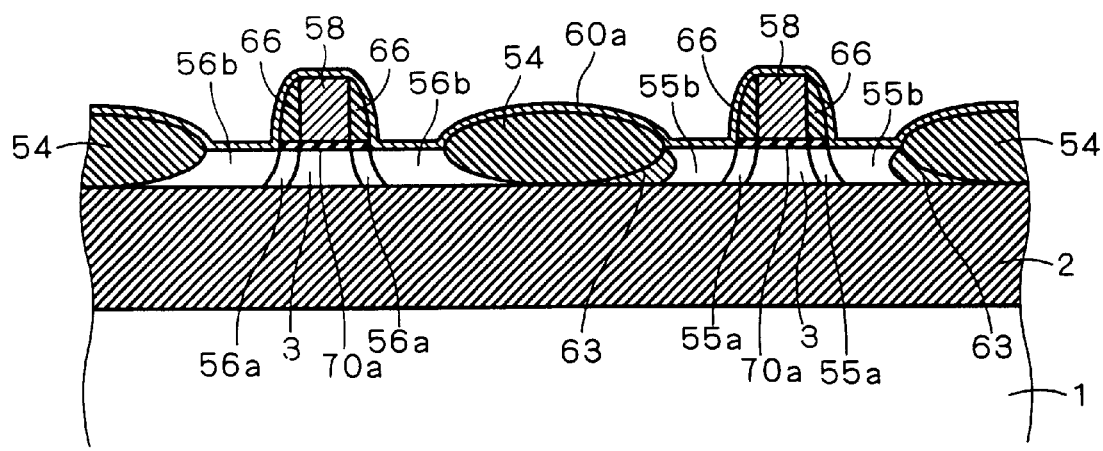
Figure 21:
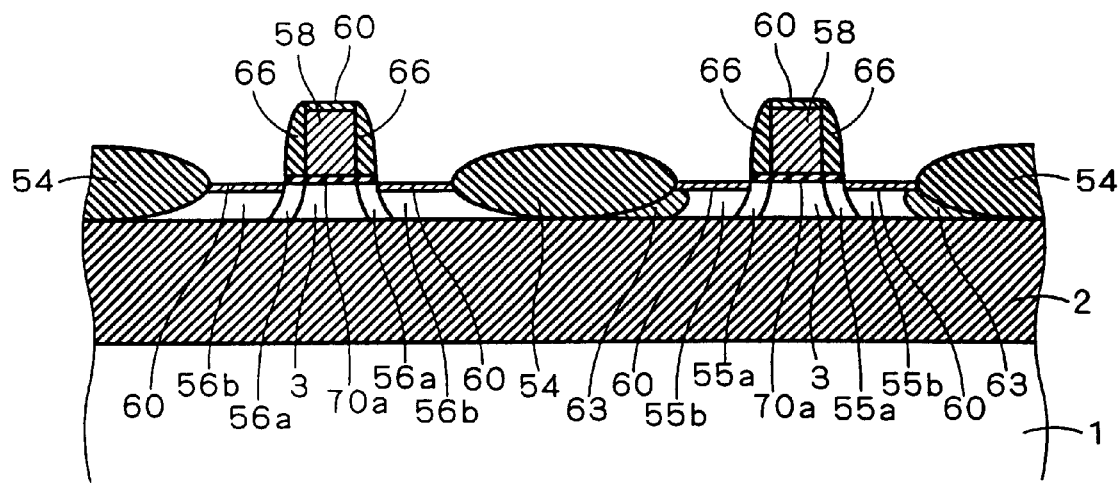
Figure 22:
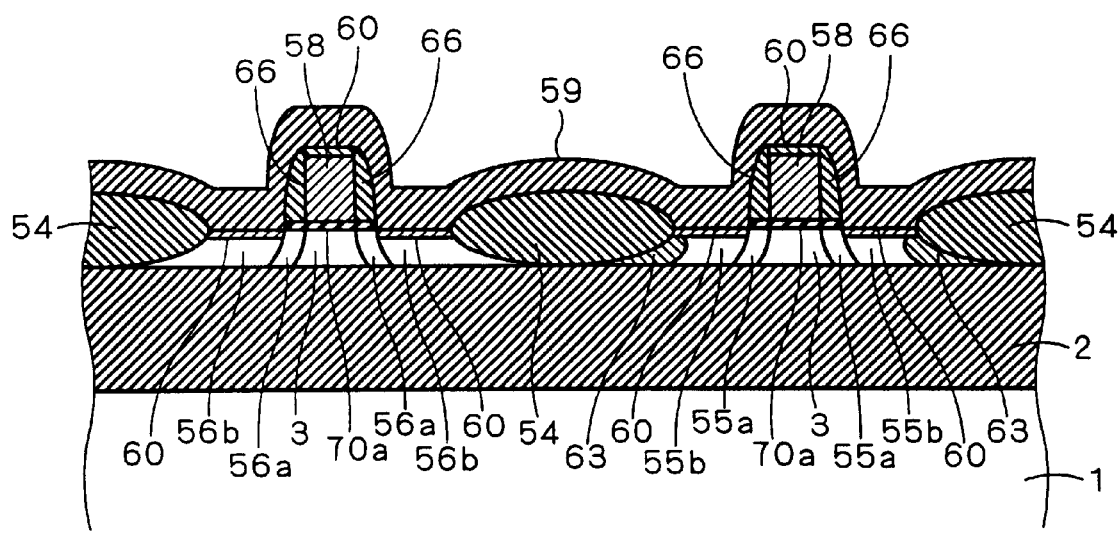
Figure 23:
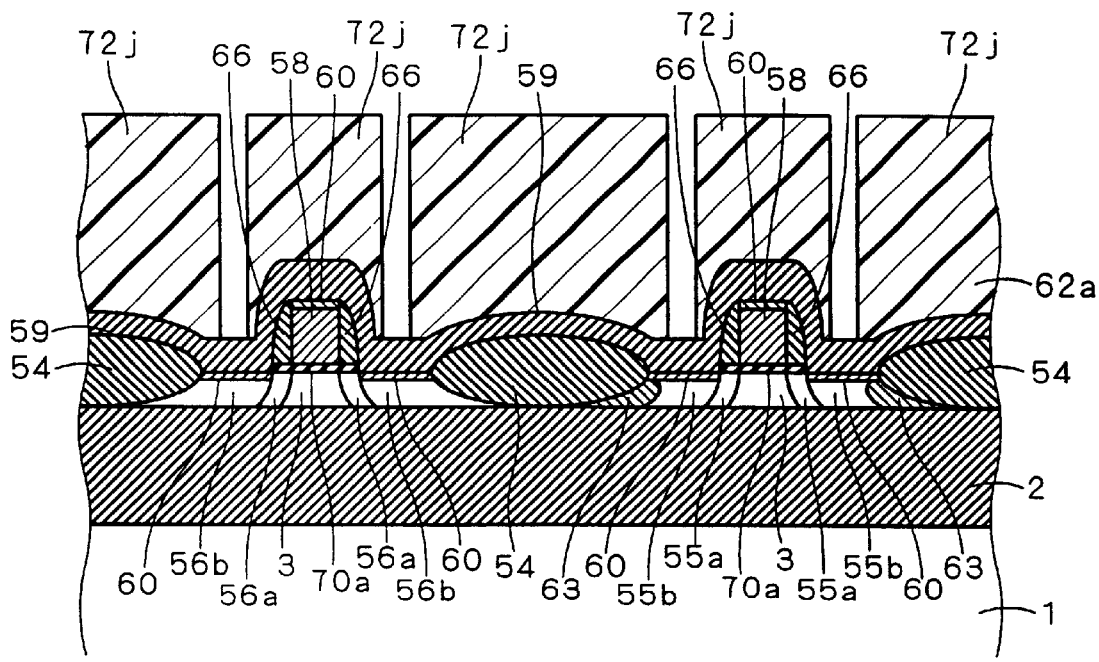
Figure 24:
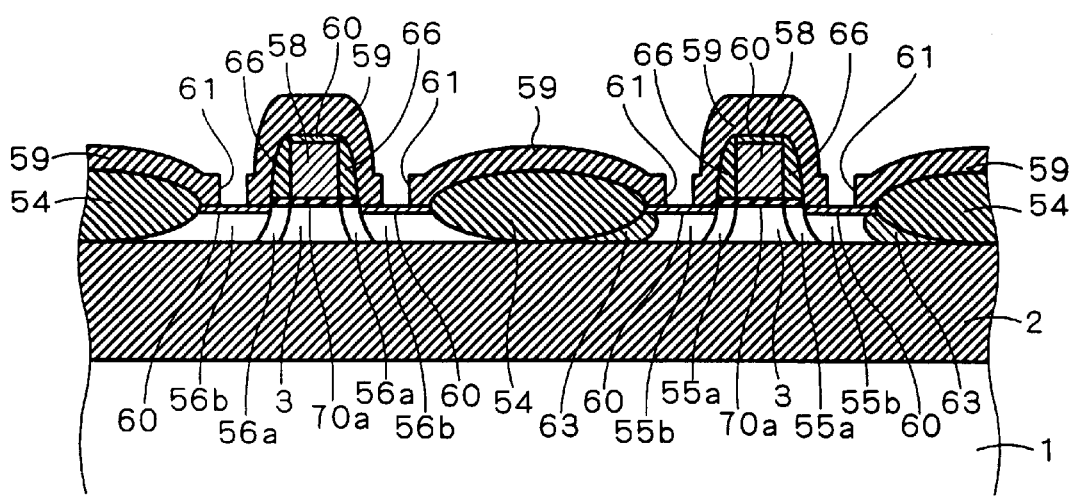
Figure 25:
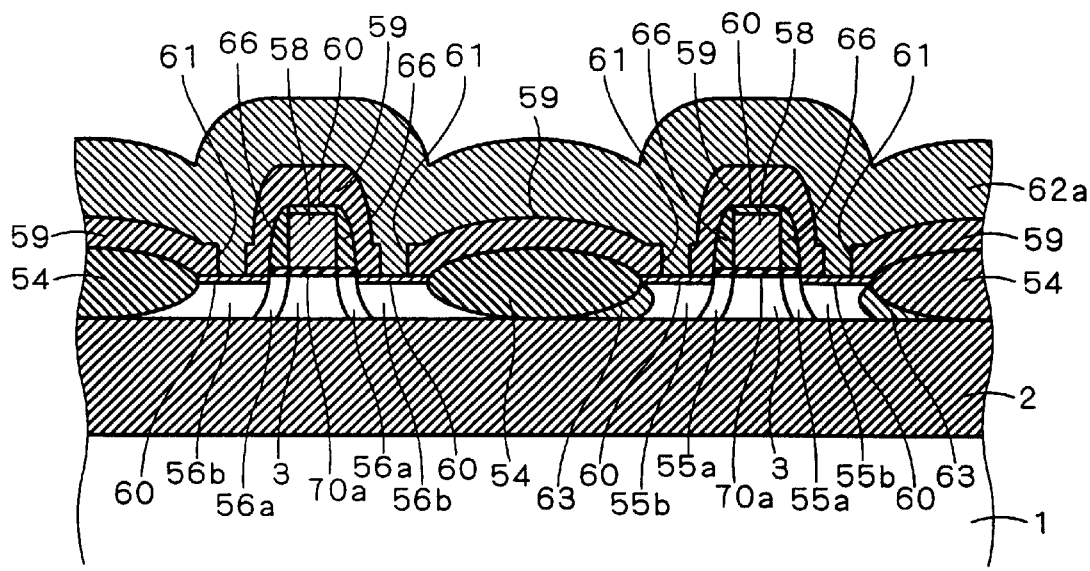

Next, by a sputtering or other method, a Ti layer 60a having a thickness of about 200 angstroms is formed on the entire surface (FIG. 20). The Ti layer 60a is subjected to lamp annealing at about 700° C. for about 30 seconds so that it reacts with an underlying silicon layer. After removing non-reactive Ti layer 60a, the remaining T*i* layer 60a is subjected to heat treatment to form titanium silicide layers 60 (FIG. 21). Then, the interlayer insulating layer 59 such as a TEOS oxide film is formed on the entire surface by a CVD or other method (FIG. 22). After that, resist patterns 72j patterned in a given shape are formed on the interlayer insulating layer 59 (FIG. 23), and with the resist patterns 72j as masks, the interlayer insulating layer 59 is etched to form the contact holes 61 (FIG. 24). In this example, titanium silicide is used, but any given metal silicide such as cobalt silicide may be used.

Figure 26:
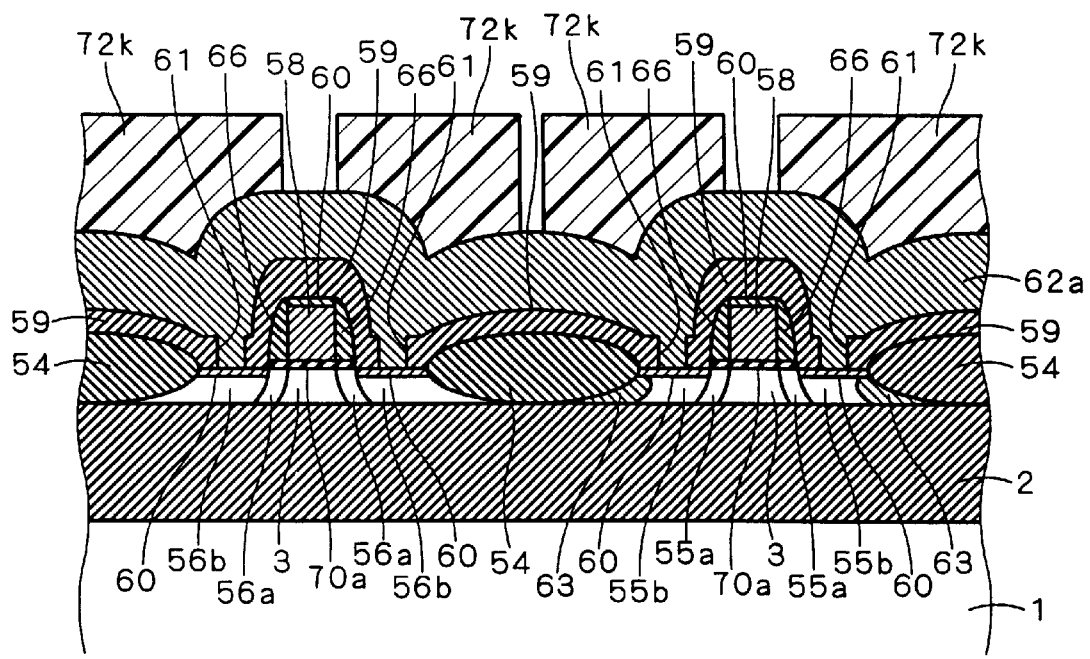

Next, a metal layer 62a containing Al is formed on the entire surface by a sputtering or other method (FIG. 25), and resist patterns 72k patterned in a given shape are formed on the metal layer 62a (FIG. 26). The metal layer 62a is then etched using the resist patterns 72k as masks, by which the structure shown in FIG. 2 is obtained.

As described so far, the n- and p-MOS transistors 64 and 65 are formed in this example, but only either of them may be formed to shorten the manufacturing time.

The process control devices are periodically manufactured, for example, at a rate of several lots between a week to a month on the same manufacturing line as the product semiconductor devices (memory devices such as a DRAM, logic devices, etc.). In the manufacture of semiconductor devices, the use of SOI wafers generally takes fewer manufacturing steps than the use of epitaxial wafers. Thus, the process control devices can be manufactured through less manufacturing steps than the product semiconductor devices. Further, instead of making a single lot into all SOI wafers, several SOI wafers may be mixed in a single lot of product epitaxial wafers to manufacture the process control devices. This avoids the necessity of providing another control-only lot consisting only of SOI wafers.

Figure 27:
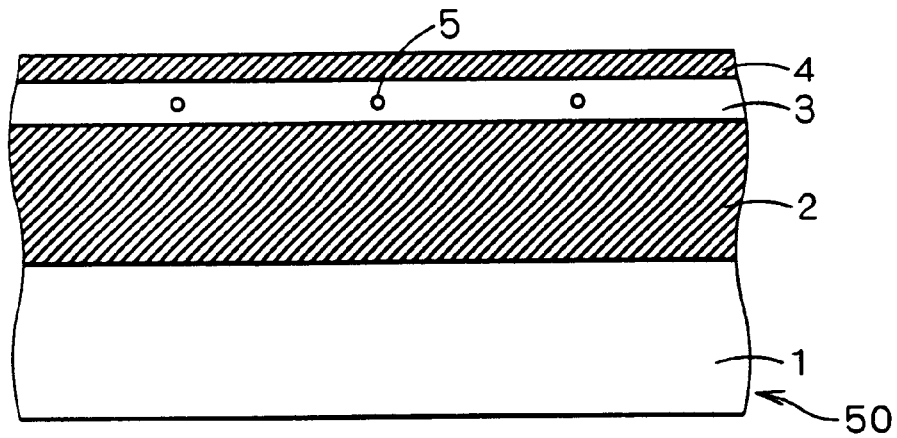
FIGS. 27 and 28 are cross-sectional views to explain a control method of semiconductor manufacturing equipment according to a first preferred embodiment of the present invention.
Figure 28:
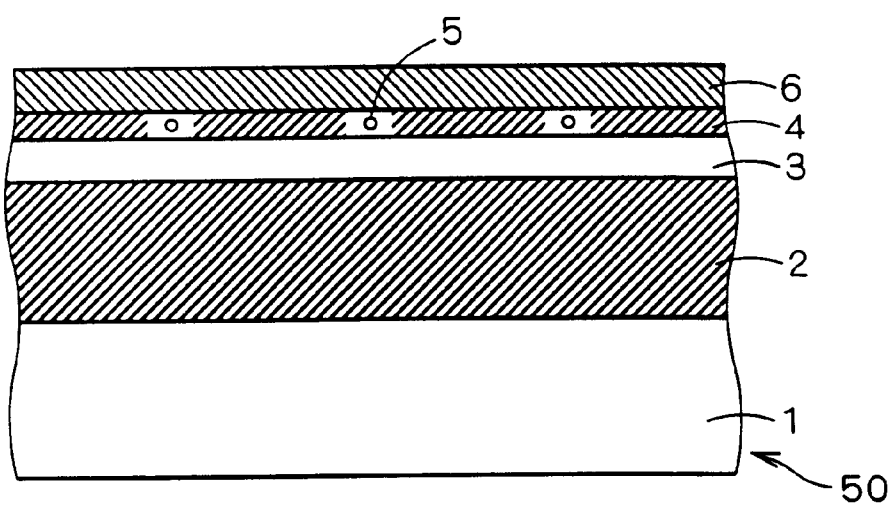

Now, we will describe a control method of the semiconductor manufacturing equipment according to the first preferred embodiment of the present invention, taking the manufacturing equipment of gate oxide films as an example. As in the conventional control method of the semiconductor manufacturing equipment, deterioration in the semiconductor manufacturing equipment can be detected by variations in the characteristics of the gate oxide film evaluated during the control of the semiconductor manufacturing process. FIGS. 27 and 28 are cross-sectional views to explain the control method of the semiconductor manufacturing equipment according to the first preferred embodiment of the present invention. In the manufacture of control devices, as previously described, the upper surface of the SOI layer 3 is cleaned and a silicon oxide film 4 (corresponding to the gate oxide film 70a in FIG. 11) is formed thereon by thermal oxidation. At this time, deterioration of the cleaning bath or the oxidation furnace causes the mixing of impurities 5 into the monitor wafer 50. Since the SOI wafer itself has little gettering capabilities and the monitor wafer 50 has no impurity trap region, those impurities are stored in the silicon oxide film 4 or in the interface between the SOI layer 3 and the silicon oxide film 4. In this condition, when a polysilicon film 6 is formed on the silicon oxide film 4 to evaluate the characteristics of the silicon oxide film 4, the evaluated characteristics vary from those in normal conditions since the stored impurities 5 cause anomalies in the thickness or quality of the silicon oxide film 4. Accordingly, we can judge deterioration in the semiconductor manufacturing equipment when the characteristics of the silicon oxide film 4 vary from the normal.

The control of the semiconductor manufacturing equipment by this method is applicable not only to the manufacturing equipment of gate oxide films but also to any other semiconductor manufacturing equipment such as an ion implanter and an etching device. For instance, deterioration of the ion implanter causes the mixing of impurities such as Fe into the monitor wafer 50. In this case, by evaluating the characteristics of the silicon oxide film 4 after ion implantation and checking the presence or absence of variations in the characteristics of the silicon oxide film 4 from the normal, deterioration of the ion implanter can be evaluated. Alternatively, there is another control method of ion implanters, wherein ions are implanted into a silicon substrate prior to the 10 semiconductor manufacturing process and impurities mixed into the silicon substrate are observed by the use of total reflection X-ray fluorescence (TXRF). This method is, however, different from the aforementioned control method of ion implanters in that it has no direct correlation with reliability of semiconductor devices, especially, with TDDB or other characteristics of gate oxide films.

According to the control methods of the semiconductor manufacturing process and the semiconductor manufacturing equipment of the first preferred embodiment, the SOI wafer is used as a monitor wafer. The SOI wafer itself has lower gettering capabilities than the epitaxial wafer used as a product wafer, and the monitor wafer has no impurity trap region. Thus, when impurities are mixed into the monitor wafer due to imperfections in the semiconductor manufacturing process or deterioration in the semiconductor manufacturing equipment, most of the impurities are stored in the gate oxide film and in the interface between the SOI layer and the gate oxide film. Accordingly, even if the amount of impurities mixed into the monitor wafer is quite small because of minor imperfections in the semiconductor manufacturing process or slight deterioration in the semiconductor manufacturing equipment, the characteristics of the gate oxide film vary from the normal. This allows early detection of imperfections in the semiconductor manufacturing process and deterioration in the semiconductor manufacturing equipment.

2. Second Preferred Embodiment

As described with the conventional techniques, the cleanliness of the clean room (semiconductor manufacturing environment) has great influence over reliability of semiconductor devices to be manufactured. Thus, it is also necessary to control the cleanliness of the clean room to ensure the reliability of semiconductor devices.

Figure 29:
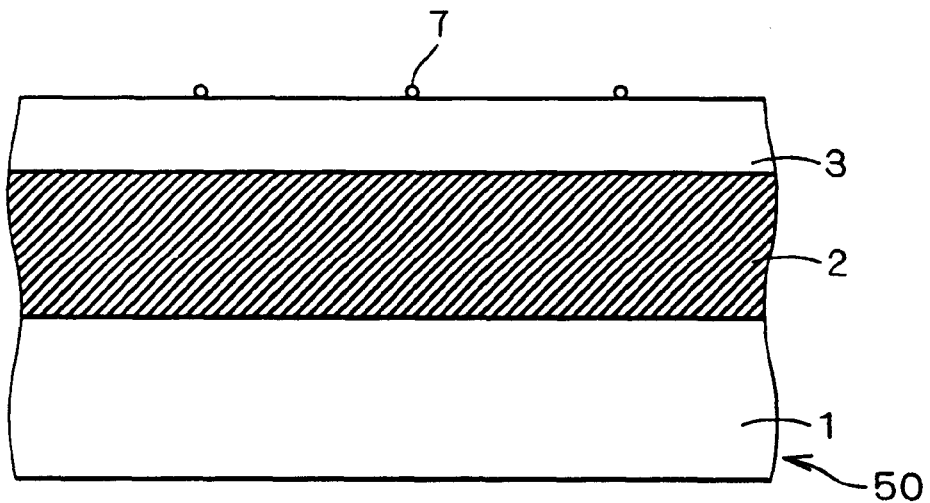
FIGS. 29 and 30 are cross-sectional views to explain a control method of a semiconductor manufacturing environment according to a second preferred embodiment of the present invention.
Figure 30:
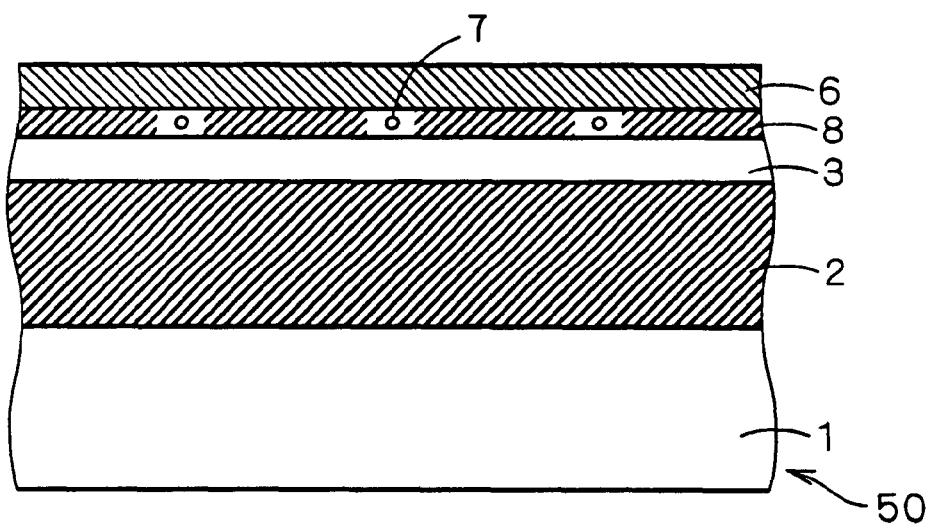

FIGS. 29 and 30 are cross-sectional view to explain a control method of a semiconductor manufacturing environment according to a second preferred embodiment of the present invention. As in the first preferred embodiment, an SOI wafer is used as the monitor wafer 50. The monitor wafer 50 is left in a clean room for a given period of time. At this time, deterioration in the cleanliness of the clean room causes deposition of impurities 7 on the SOI layer 3. When a process control device is manufactured after that by the same method as described in the first preferred embodiment, those impurities 7 are stored in the silicon oxide film 8 and in the interface between the SOI layer 3 and the silicon oxide film 8 in the step of forming the silicon oxide film 8 (corresponding to the gate oxide film 70a in FIG. 11) on the SOI layer 3. In this condition, when the polysilicon film 6 is formed on the silicon oxide film 8 to evaluate the characteristics of the silicon oxide film 8, the evaluated characteristics vary from the normal since the stored impurities 7 cause anomalies in the thickness or quality of the silicon oxide film 8. Accordingly, we can judge deterioration in the cleanliness of the clean room when the characteristics of the silicon oxide film 8 vary from the normal.

According to the control method of the semiconductor manufacturing environment of the second preferred embodiment, an SOI wafer is used as a monitor wafer. Thus, when a gate oxide film is formed on the SOI layer with impurities deposited on the monitor wafer due to deterioration in the cleanliness of the semiconductor manufacturing environment, most of the impurities are stored in the gate oxide film and in the interface between the SOI layer and the gate oxide film. Accordingly, even if the amount of impurities deposited on the monitor wafer is quite small due to slight deterioration in the cleanliness of the semiconductor manufacturing environment, the characteristics of the gate oxide film vary from the normal. This allows early detection of the variations in the semiconductor manufacturing environment.

In the first and second preferred embodiments, the SOI wafer is used as a monitor wafer, but the monitor wafer may be any other wafer that has lower gettering capabilities than the product wafer. For example, it may be a CZ wafer or an epitaxial wafer produced by growing an p-type epitaxial layer on a $p^{31}$-type silicon substrate, with no impurity trap region.

While the invention has been described in detail, the foregoing description is in all aspects illustrative and not restrictive. It is understood that numerous other modifications and variations can be devised without departing from the scope of the invention.

What is claimed is:

1. A control method of a semiconductor manufacturing process for manufacturing a semiconductor device as a product, the method comprising the steps of:

(a) preparing a monitor wafer having lower gettering capabilities than a product wafer on which said semiconductor device is formed;

(b) performing said semiconductor manufacturing process for said monitor wafer;

(c) forming an insulating film on said monitor wafer in said step (b) or in a step other than said step (b); and (d) evaluating imperfections in said semiconductor manufacturing process by conducting a test on the characteristics of said insulating film and detecting the mixing of impurities into said monitor wafer during said semiconductor manufacturing process by variations in said characteristics of said insulating film.

2. The control method according to claim 1, wherein
in said step (a), either of an SOI wafer, a CZ wafer, or an epitaxial wafer produced by growing a p-type epitaxial wafer on a $p^-$ type substrate is prepared as said monitor wafer, each wafer having no extrinsic impurity trap region.

3. The control method according to claim 2, wherein said impurity trap region is a polysilicon back seal.

4. The control method according to claim 1, wherein
said test in said step (d) is either leakage-current evaluation, C-V evaluation, time zero dielectric breakdown evaluation, or time dependence dilectric breakdown evaluation.

5. A control method of semiconductor manufacturing equipment for manufacturing a semiconductor device as a product, the method comprising the steps of:

(a) preparing a monitor wafer having lower gettering capabilities than a product wafer on which said semiconductor device is formed;

(b) performing a predetermined semiconductor manufacturing process for said monitor wafer by the use of said semiconductor manufacturing equipment;

(c) forming an insulating film on said monitor wafer in said step (b) or in a step other than said step (b); and (d) evaluating deterioration in said semiconductor manufacturing equipment by conducting a test on the characteristics of said insulating film and detecting the mixing of impurities into said monitor wafer during said semiconductor manufacturing process by variations in said characteristics of said insulating film.

6. The control method according to claim 5, wherein
in said step (a), either of an SOI wafer, a CZ wafer, or an epitaxial wafer produced by growing a p-type epitaxial layer on a $p^{31}$ type substrate is prepared as said monitor wafer, each wafer having no extrinsic impurity trap region.

7. The control method according to claim 6, wherein said impurity trap region is a polysilicon back seal.

8. The control method according to claim 5, wherein
said test in said step (d) is either leakage-current evaluation, C-V evaluation, time zero dielectric breakdown evaluation, or time dependence dielectric breakdown evaluation.

9. A control method of a semiconductor manufacturing environment for performing a semiconductor manufacturing process for manufacturing a semiconductor device as a product, the method comprising the steps of:

(a) preparing a monitor wafer having lower gettering capability than a product after on which said semiconductor device is formed;

(b) leaving said monitor wafer in said semiconductor manufacturing environment for a given period of time;

(c) after said step (b), forming an insulating film on said monitor wafer;

(d) evaluating variations in said semiconductor manufacturing environment by conducting a test on the characteristics of said insulating film and detecting deposition of impurities on said monitor wafer during neglect of said monitor wafer by variations in said characteristics of said insulating film.

10. The control method according to claim 9, wherein
in said step (a), either of an SOI wafer, a CZ wafer, or an epitaxial wafer produced by growing a p-type epitaxial layer on a $p^-$ type substrate is prepared as said monitor wafer, each wafer having no extrinsic impurity trap region.

11. The control method according to claim 10, wherein said impurity trap region is a polysilicon back seal.

12. The control method according to claim 9, wherein
said test in said step (d) is either leakage-current evaluation, C-V evaluation, time zero dielectric breakdown evaluation, or time dependence dielectric breakdown evaluation.

* * * * *